United States Patent
Napier et al.

[11] Patent Number: 5,822,479
[45] Date of Patent: Oct. 13, 1998

[54] WRITING DIFFRACTION GRATINGS WITH INTERFERENCE FRINGE PATTERNS

[75] Inventors: Bruce Napier; Nicholas John Phillips, both of Loughborough, United Kingdom

[73] Assignee: Northern Telecom Limited, Montreal, Canada

[21] Appl. No.: 788,615

[22] Filed: Jan. 24, 1997

[51] Int. Cl.[6] .................................................. G02B 6/34
[52] U.S. Cl. ............................. 385/37; 385/10; 385/31; 359/566; 359/900
[58] Field of Search ................................. 385/37, 10, 31, 385/33, 51, 39, 123, 147, 28; 359/566, 573, 900, 569

[56] References Cited

U.S. PATENT DOCUMENTS 5,066,133  11/1991  Brienza ..................................... 359/570
5,216,739  6/1993   Hill et al. ................................. 385/123
5,652,818  7/1997   Byron ........................................ 385/37

OTHER PUBLICATIONS

Kashyap et al Super–step–chirped fibre Bragg gratings Electronics Letters 18 Jul. 1996 vol. 32 No. 15 Published in GB.

*Primary Examiner*—Phan T. H. Palmer
*Attorney, Agent, or Firm*—John D. Crane

[57] ABSTRACT

A progressive method of writing a long grating in a substrate using a pulsed interference fringe pattern. The substrate is moved through the fringe pattern while being continuously illuminated with light of a different wavelength to produce a diffracted beam whose phase is monitored to produce a control signal that regulates the pulsing of the writing beam to ensure that the fringe pattern is present only when it is in correct registry with the grating being written.

19 Claims, 3 Drawing Sheets

WRITING DIFFRACTION GRATINGS WITH INTERFERENCE FRINGE PATTERNS

BACKGROUND TO THE INVENTION

This invention relates to the use of an interference fringe pattern, typically a fringe pattern of blue or ultra-violet light, to write a diffraction grating in a substrate.

Gratings that do not have an inconveniently small pitch, or an inconveniently large number of grating elements, can be created by a method in which the grating elements are individually written one at a time. After each grating element is written, the substrate is indexed with respect to the writing apparatus the required distance to bring it into position for the writing of the next adjacent element. Amongst the available writing methods, the writing of an individual line may, for instance, take the form of mechanical scribing, the form of writing with an e-beam in e-beam resist, or the writing with ultra-violet light direct into a photosensitive optical waveguide. An example of this last-mentioned method is to be found in the specification of U.S. Pat. No. 5,216,739, the method being applied to the writing of a grating with a pitch of 590 $\mu$m in an optical fibre waveguide in order to produce coupling between two modes capable of propagating in that fibre with slightly different propagation constants. The useful number of grating elements that can be written by this method is limited by the cumulative effects of indexing errors.

An alternative approach is to write a group of grating elements simultaneously, using a fringe pattern generated by the interference of two beams of light. For a given grating pitch, the number of elements that can be simultaneously written is limited by the width of the interfering beams of light. In principle a longer grating can be created by writing it in sections, writing all the elements of a single section simultaneously and then indexing the substrate preparatory for the writing of the next section.

By this means, however, the problems associated with the precision of indexing are reintroduced because it will normally be a requirement that the pitch of the grating continues without 'stitch errors' in an essentially seamless way from one section to the next. In some suitable circumstance the problem of stitch errors can be overcome in the manner taught in the paper by R Kashyap et al. entitled 'Super-step-chirped fibre Bragg gratings', Electronics Letters (18 Jul. 1986) Vol. 32, No. 15, pp 1394–6. In the particular context described in this paper it is possible to leave gaps between adjacent grating sections formed in an optical waveguide, and then to use ultra-violet light to trim the effective optical path distance of each gap to secure a desired phase relationship between the termination of the grating section at one end of the gap and the commencement of the grating section at the other end. Even within this context of gratings produced in optical waveguide, limitations are imposed on the use of the method if adjacent sections reflect spectral bands that overlap, for under these circumstances the two sections and their intervening gap co-operate to form a kind of Fabry Perot resonator.

The problem of creating long Bragg gratings in optical fibre waveguides is also addressed in the specification of U.S. Pat. No. 5,066,133, but the method described therein involves the use of a so-called Doppler shift inscription grating to generate the Bragg grating. Accordingly it is seen that in effect one problem, the creating of the long Bragg grating, is merely exchanged for a related problem, the creation of the long Doppler shift inscription grating.

SUMMARY OF THE INVENTION

It is an object of the present invention to provide an interference generated fringe pattern method of writing long gratings using on-line optical monitoring to ensure that successive grating elements are written in the required spatial relationship with their predecessors.

The invention is particularly concerned with a method of writing that enables the manufacture of gratings with a greater number of grating elements than the number of fringes in the fringe pattern employed in writing it.

According to the present invention there is provided a method of writing a grating in a medium, in which method successive grating elements of the grating are progressively created using a pulsed fringe pattern moved relative to the medium, wherein, as the grating elements are created in the medium, they are interrogated with a beam of light to produce a diffracted beam of light, the phase of which diffracted beam is employed to generate a control signal which is used to regulate the pulsing of the fringe pattern so that pulses occur only when there is coincidence between individual members of the created grating elements and individual fringes of the fringe pattern.

The fringe pattern is typically an interference generated fringe pattern of light, but it could alternatively be an interference generated fringe pattern of electrons.

The medium in which the grating is written may for instance be a film of photoresist or e-beam resist. The resist film may then be used as a mask to transfer the pattern of the grating directly or indirectly into a substrate underlying the resist. Alternatively the fringe pattern may be employed to write the grating directly into the medium that is to constitute the final grating. For instance the writing can be direct writing into an optical waveguide to produce a Bragg grating in that waveguide by means of the photorefractive effect of ultra-violet light.

The invention also provides a method of writing a grating in a medium, wherein grating elements of the grating are created in the medium by a pulsed effectively linear fringe pattern, wherein light of a wavelength not employed for said creation of the grating is directed at ones of the written grating elements during said writing to form a diffracted beam of light diffracted by said ones of the written grating elements, wherein the medium is progressively moved relative to the fringe pattern in a manner repetitively providing coincidence between individual ones of the written grating elements and different ones of the fringes of the fringe pattern, and the phase of the diffracted beam of light is monitored to generate a control signal which is employed to control the pulsing of the fringe pattern such that, subsequent to the commencement of said relative movement following commencement of the creation of the grating elements, each succeeding pulse is timed to occur only when there is coincidence between individual ones of the grating elements and individual ones of the fringes of the fringe pattern.

The invention further provides a method of progressively writing in a medium a grating composed of a series of grating elements spaced at a uniform pitch, which grating elements are created in the medium by a pulsed fringe pattern composed of a set of effectively linear fringes spaced at a uniform pitch, wherein the medium is moved progressively relative to the fringe pattern so that the written grating elements pass through coincidence with different fringes of the fringe pattern, wherein light of a wavelength not employed for said creation of the grating is directed at ones of the written grating elements during said writing to form a diffracted beam of light diffracted by said ones of the written grating elements, wherein the phase of said diffracted beam of light is monitored to generate a control signal which is employed to control the pulsing of the fringe pattern such that, once the writing of the grating elements has commenced, the fringe pattern pulses are timed to occur only when there is coincidence between individual ones of the grating elements and individual fringes of the fringe pattern.

A convenient way of using the phase of the diffracted beam of light is to regulate the pulsing of the fringe pattern is to interfere that diffracted beam on a photodetector with an equivalent beam of known phase. This beam of known phase may be generated by diffraction of light from a control grating that is maintained in fixed spatial relationship with the fringe pattern. Alternatively the beam of known phase may, for instance, be derived from specular reflection from the surface of the medium in which the grating is being written.

BRIEF DESCRIPTION OF THE DRAWINGS

There follows a description of the writing of gratings whose lengths are not limited either by the size of the writing beam or by that of any of the optical components in the apparatus employed to write those gratings. The description refers to the accompanying drawings in which.

DETAILED DESCRIPTION OF A PREFERRED EMBODIMENT

Figure 1:
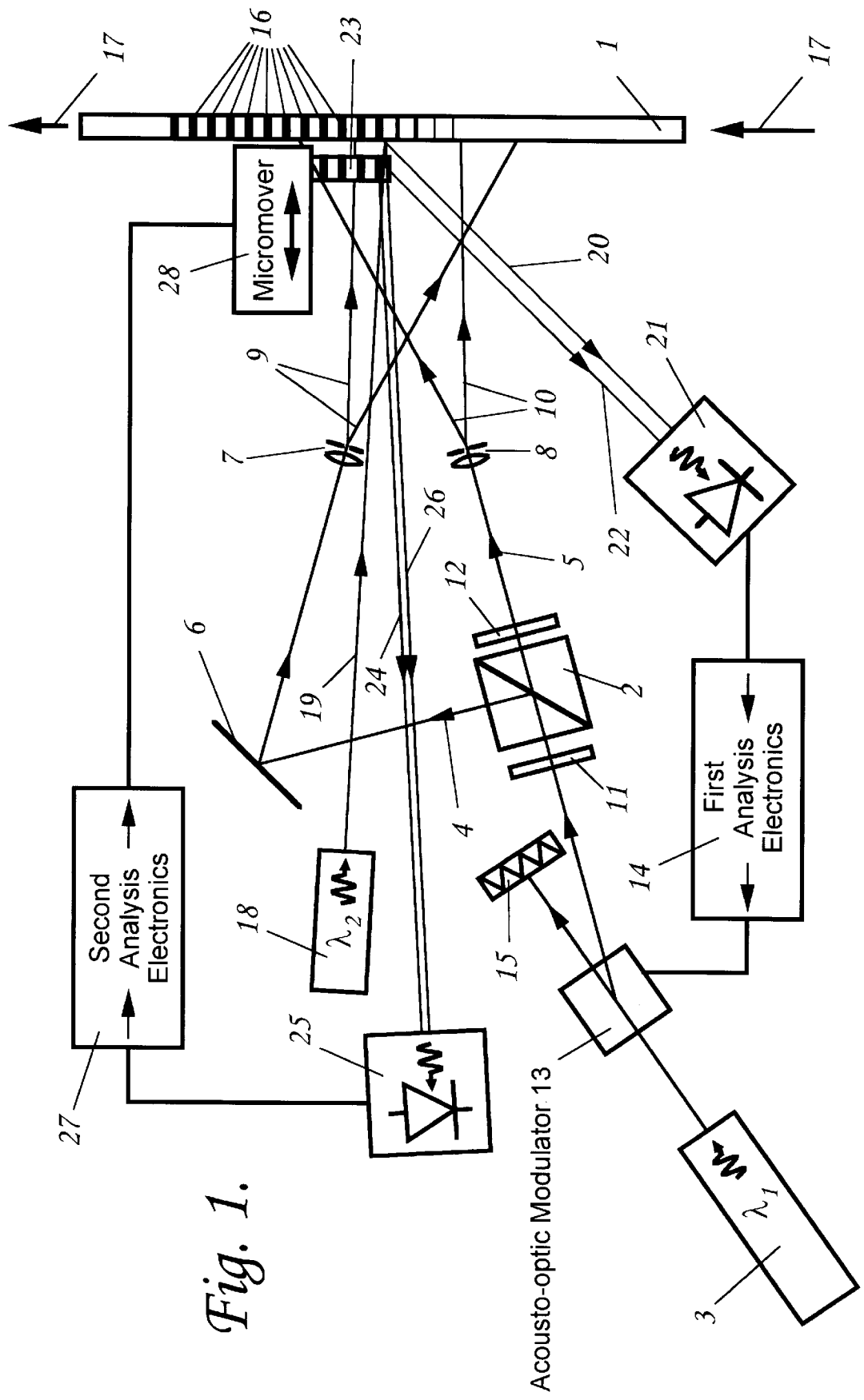
FIGS. 1 to 3 are schematic depictions respectively of three alternative specific forms of apparatus employed for such writing.

Referring to the accompanying drawings, the apparatus of FIG. 1 is designed for writing a grating in a medium indicated generally at 1. By way of specific example this medium can be a film of photoresist (for instance a film of positive resist marketed by Shipley under the designation AZ 1350) on a chromium layer on a quartz substrate. Subsequent to the writing of a grating in the photoresist, the latent image fringe pattern is developed to form a mask for etching a corresponding grating into the underlying chromium layer. This grating in the chromium layer is then, in its turn, employed as a mask for the etching of a corresponding grating in the underlying quartz. In this way a phase grating is formed in the quartz which can be used to create a fringe pattern in the core of an optical waveguide, typically an optical fibre waveguide, located in close proximity to the quartz phase grating. With the aid of such a fringe pattern a Bragg grating can be created in the waveguide by utilisation of the photorefractive effect in the core of that waveguide. With appropriate modification of the apparatus, it can alternatively be used to employ the photorefractive effect to write a Bragg grating directly into an optical waveguide instead of working through the intermediary photoresist grating and phase grating.

The apparatus of FIG. 1 can be considered as being composed of three parts. The first of these parts comprises a part employed to generate an interference fringe pattern in the medium 1. The second part comprises a part employed to generate a diffracted beam of light of a different wavelength from that used to generate the fringe pattern and, with the aid of a control grating, to use the phase of that diffracted beam to generate a control signal for regulating the pulsing of the fringe pattern. The third part comprises a part employed to regulate the spacing between the control grating and the medium 1 in which the grating is being written.

The first part, the part employed to generate the interference pattern in the medium 1, uses a polarisation sensitive beam-splitter 2 to divide light from a laser 3 into two beams 4 and 5. This light is of a first wavelength $\lambda_1$, a wavelength that reacts with the medium 1. Beam 4 is reflected by a mirror 6, and then the two beams are directed through associated lens and spatial light filter combinations 7 and 8 to form beams 9 and 10 which overlap in part at medium 1. In the region of overlap, the two beams 9 and 10 interfere to form a fringe pattern whose contrast is controlled by the choice of orientation of two half-wave plates 11 and 12.

Thus far in the description of this first part of the apparatus has not been distinguished from a standard apparatus for generating an interference fringe pattern. The light reaching the beam splitter 2 from the laser 3 reaches it by way of an acousto-optic modulator 13 driven by first analysis electronics 14. The output of this electronics 14 switches the modulator 13 between two states. In one state the light from laser 3 is directed by modulator 13 into the polarisation beam-splitter 2, while in the other state the light is directed by it into a non-reflecting absorber 15.

Each time the fringe pattern is pulsed under the control of the first analysis electronics 14, the light of the pattern interacts with the medium 1 to produce a corresponding pattern of grating elements 16 in some physically observable parameter of that medium. Typically the intensity of the fringe pattern and the duration of the pulses will be such that several hundreds or thousands of pulses are required to produce the required depth of modulation of that parameter. With repetitive pulsing, and with a medium 1 held in fixed spatial relationship with respect to the fringe pattern, a grating of the required modulation depth can thus be built up in the medium, but the number of grating elements 16 in the grating is limited by the number of fringes in the fringe pattern. To overcome this limitation, the medium is moved relative to the fringe pattern between pulses in the direction indicated by arrows 17, and the pulses are arranged to occur only when already written grating elements lying within the range of the fringe pattern are in registry with those fringes. Typically, but not necessarily, it will be arranged that one pulse will be caused to occur each time the relative movement has been augmented by one grating element pitch. Under these circumstances each successive grating element begins to be written as the relative movement causes it to enter the fringe pattern. It then gradually gains in strength (modulation depth) as it moves through the fringe pattern, and leaves the fringe pattern at its full strength on the far side. If the relative movement is discontinuous, it is possible to arrange for there to be quite a number of pulses at each point of registry. At the commencement of the writing of a grating the modulation depth produced by the first pulse on its own will be so small as to be quite inadequate for acceptable control of subsequent pulsing. Under these circumstances therefore the pulsing is continued without relative movement until sufficient modulation depth is achieved, and only then is relative movement commenced.

Attention is next turned to the second part of the apparatus of FIG. 1, the part concerned with the control of the pulsing. For this control, light from a second laser 18 emitting at a wavelength $\lambda_2$ that does not react with medium 1, or alternatively at $\lambda_2$ and $\lambda_3$ in a dual wavelength configuration in which neither $\lambda_2$ nor $\lambda_3$ reacts with the medium 1, is directed in a beam 19 at the already written grating elements 16 in the region of the point at which they are emerging from the fringe pattern generated by laser 3 emitting at wavelength $\lambda_1$. This laser beam 19 is diffracted by those grating elements to produce a diffracted beam 20 which is arranged to be incident upon a photodetector 21. The laser beam 19 is in fixed spatial relationship with respect to the fringe pattern generated by laser 3, and so the phase of diffracted beam 20 at the photodetector changes as the grating elements 16 are carried along by the movement of the medium 1. Clearly the phase sweeps through $2\pi$ each time the grating elements 16 move through one pitch distance. If one can measure this phase, then it clearly is possible to use such measurement to control the pulsing of the acoustic modulator so as to obtain the required registry condition. An actual measurement of the phase is not required: all that is required is an indication of when the desired phase condition is present. One convenient way of providing such an indication is to interfere, at the photodetector 21, the diffracted beam with another beam 22 of equivalent amplitude, and whose phase is fixed in relationship with the desired phase, preferably at $\pi$ from the desired phase. Under these conditions there will be destructive interference, and hence the signal output from the photodetector 21 will pass through a minimum whenever the desired phase relationship of diffracted beam 20 occurs. Thus an output taken from the photodetector 21, and applied as an input to the first analysis electronics 14, provides a suitable control signal for its use in regulating the operation of the acoustic modulator 13. The beam 22 of equivalent amplitude and appropriate phase may conveniently be provided by a control grating 23 that is also illuminated by beam 19. This control grating 23 has grating elements at the same pitch as the written grating elements 16 arranged to extend in the same direction with the two gratings extending in parallel planes at constant separation. The need for constant separation arises because if, in the course of the movement of the medium 1, this separation were to change, such a change would upset the phase relationship at detector 21.

Maintenance of constancy of separation is the function of the third part of the apparatus of FIG. 1. This function can be performed also using the beam of light 19 emitted by laser 18. To this end the part of the beam of light 19 that is specularly reflected by the control grating as beam 24 is interfered on a photodetector 25 with the part of the beam of light 19 that is specularly reflected by the medium 1 as beam 26. The output of the photodetector 25 is fed to second analysis electronics 27 to provide a feedback control output controlling the operation of a micromover 28 to which the control grating 23 is attached, such operation being such as to provide the desired constancy of separation between the control grating 23 and the medium 1.

Figure 2:
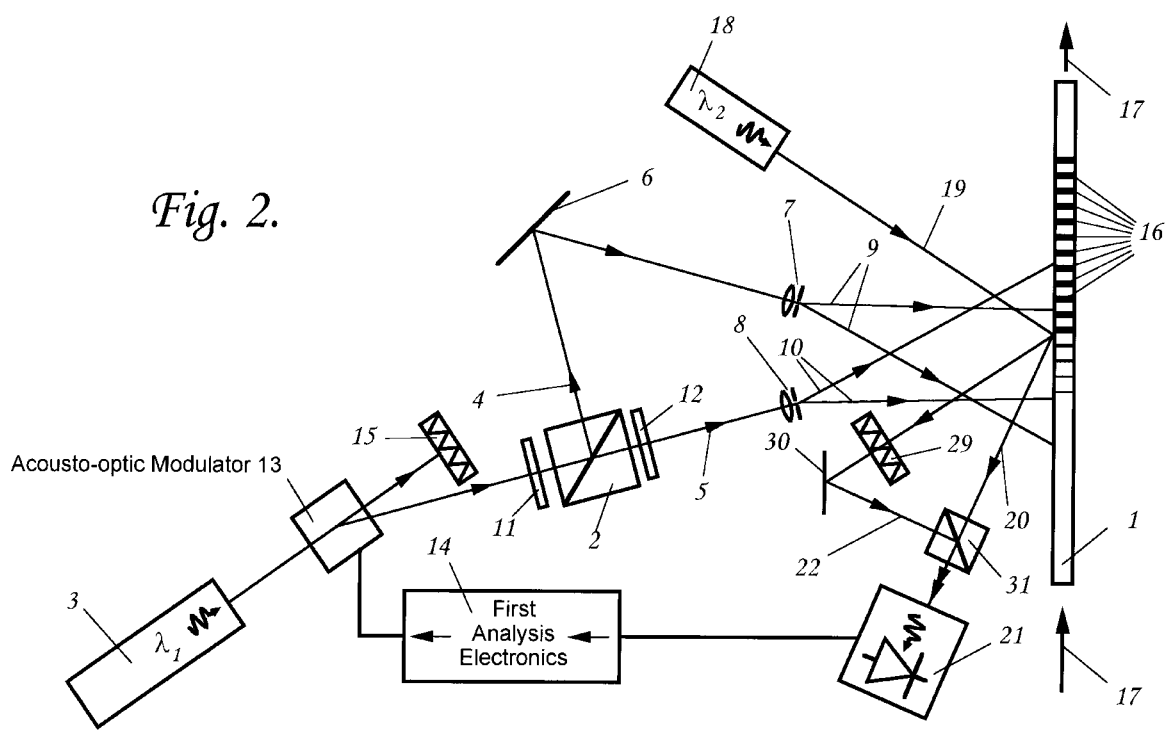

Attention is now turned to the apparatus of FIG. 2. This apparatus has many components that have their counterparts in the apparatus of FIG. 1, and such components are identified by the same index numerals in both instances. The primary difference between the two sets of apparatus lies in the way that the indication of the desired phase condition of the diffracted beam 20 of light of wavelength $\lambda_2$ is determined. In the case of the apparatus of FIG. 1, this is determined with the aid of light diffracted from a control grating 23. In the case of the apparatus of FIG. 2, such use of a control grating is dispensed with, and instead alternative use is made of the light of wavelength $\lambda_2$ that is specularly reflected by the medium 1 as beam 22. After suitable attenuation in an attenuator 29, and reflection in a mirror 30, the two beams 20 and 22, now of substantially equal intensity, are combined by combiner 31 to interfere on the photosensitive surface of photodetector 21. The avoidance of the need for a control grating 23 means that the second photodetector 25, the second analysis electronics 27, and the micromover 28 can also be dispensed with.

In both the apparatus of FIG. 1, and that of FIG. 2, the fringe pattern is formed by using a beam-splitter 2 to divide the amplitude of the emission from laser 3 into two components which are subsequently combined. An alternative way of forming the requisite fringe pattern relies upon division of wavefront instead of division of amplitude. For this purpose, the emission from laser 3 is arranged to be incident upon a diffraction grating (a wavefront incident upon such a grating is divided by its grating elements), and the fringe pattern is generated close-by by the overlapping of different diffraction orders. This is the approach adopted in the case of the apparatus of FIG. 3, which employs a phase grating as its diffraction grating.

Figure 3:
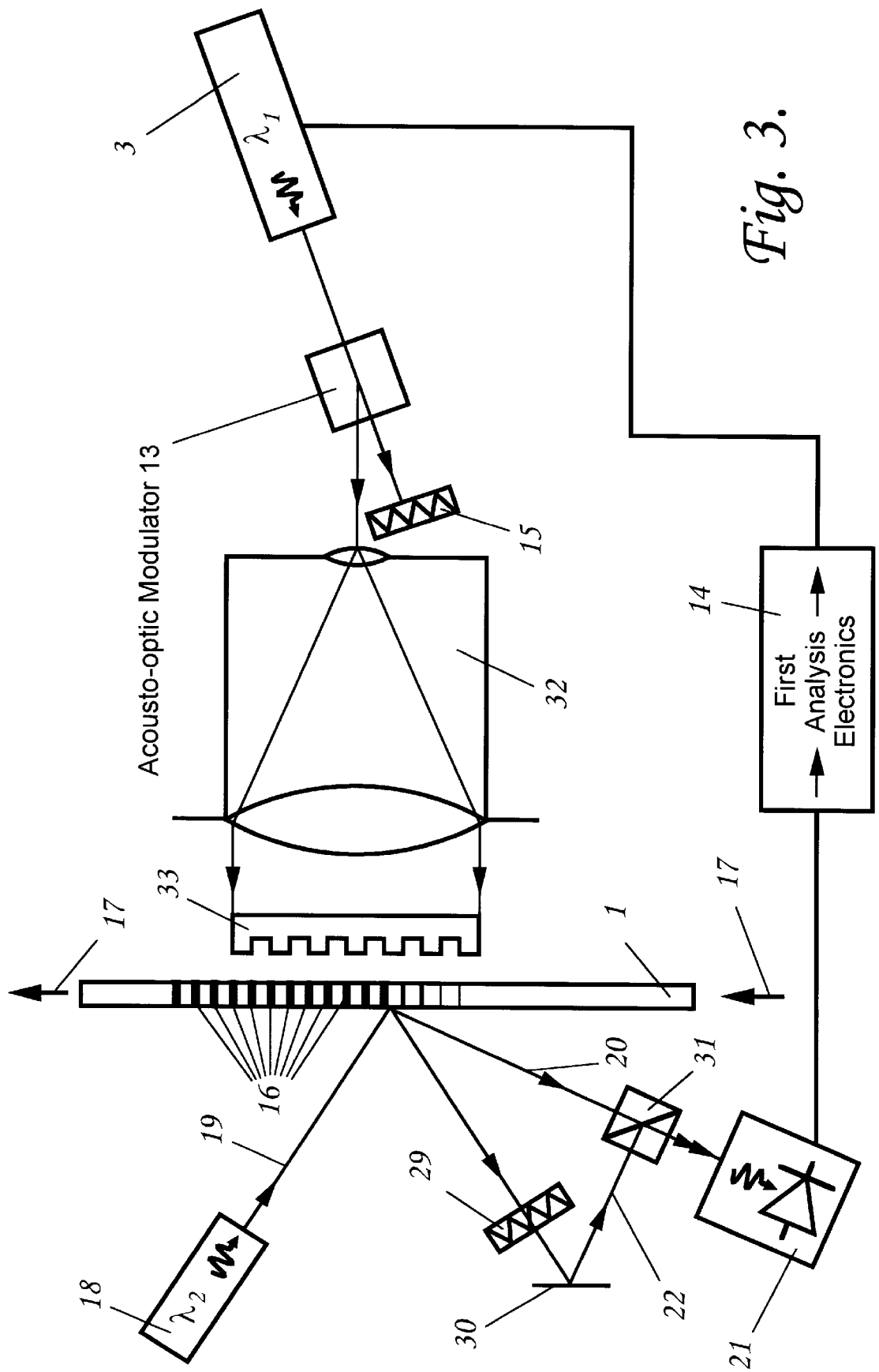

The apparatus of FIG. 3 similarly has many components that have their counterparts in the apparatus of FIG. 2, or in both that of FIG. 1 and that of FIG. 2. Such components are identified by the same index numerals in the differnt figures. The apparatus of FIG. 3 employs the same method of obtaining the indication of the desired phase condition of the diffracted beam 20 of light of wavelength $\lambda_2$ as is employed in the apparatus of FIG. 2. This indication is used in the same manner to control the pulsing of the emission of laser 3, switching that emission into the non-reflecting absorber whenever it is not wanted for generating the fringe pattern. The arrangement of the beam-splitter 2, mirror 6, lens and spatial light filter combinations 7 and 8, and half-wave plates 11 and 12, is taken by the combination of an alternative lens and spatial light filter combination 32, and a phase grating 33. The grating 33 is located in close proximity to the medium 1, while the lens and spatial light filter combination is arranged to flood this grating with collimated light so as to form a fringe pattern, of twice the pitch of the grating, just beyond the far side of that grating from the incident light. The particular arrangement of FIG. 3 has light of wavelength $\lambda_1$ and $\lambda_2$ incident upon the medium 1 from opposite sides, and so in this instance the medium 1 should not be supported upon a substrate that is opaque to both wavelengths. This would for instance generally preclude the use of a substrate incorporating a film of chromium, but its place can in suitable circumstances be taken by a film of iron oxide in a form providing adequate transmission in the red region of the visible spectrum.

The pitch of the fringes produced by the division of wavefront approach of the apparatus of FIG. 3 is not dependent upon the wavelength $\lambda_1$ emitted by laser 3, but instead is determined by the pitch of grating 33. This means that, in the case of this apparatus, the stability of emission wavelength of the laser 3 is not critical. The situation is somewhat different in respect of the fringe patterns produced by the division of amplitude approach of the apparatus of FIG. 1 and that of FIG. 2. In these instances the pitch of the fringe pattern is determined in part by the value of the emission wavelength $\lambda_1$, and in part by the angle between the two beams respectively formed by the lens and spatial light filter combinations 7 and 8. For creating gratings in a photoresist medium 1, the laser 3 may conveniently be constituted by an argon ion laser emitting typically about 100 mW at 457.9 nm, or, in order to provide greater sensitivity, a helium cadmium laser emitting at 441.6 nm. A shorter emission wavelength laser emitting in the ultra-violet is required for direct writing of a Bragg reflection grating in an optical waveguide using the photorefractive effect. This may for instance be constituted by a frequency doubled argon ion laser emitting at 244 nm.

Clearly a uniform pitch grating can be written in medium 1 with the apparatus of any one of FIGS. 1 to 3 but, because the pitch of the fringe pattern using the apparatus of FIG. 2 depends in part upon the angle between the two interfering beams that create that fringe pattern, it should also be clear that a chirped grating (a grating whose pitch is a function of position along the length of the grating) can be written in medium 1 using this apparatus by arranging to vary this angle in a smooth controlled manner during the writing process.

A stable wavelength is a prerequisite for precise determination of the desired phase condition of the diffracted beam 20 from laser 18 emitting at $\lambda_2$. In respect of gratings created in a medium 1 constituted by a layer of photoresist, this wavelength $\lambda_2$ may be provided by the output at 532 nm provided by a stabilised frequency doubled YAG laser.

We claim:

1. A method of writing a grating in a medium, in which method successive grating elements of the grating are progressively created using a pulsed fringe pattern moved relative to the medium, wherein, as the grating elements are created in the medium, they are interrogated with a beam of light to produce a diffracted beam of light, the phase of which diffracted beam is employed to generate a control signal which is used to regulate the pulsing of the fringe pattern so that pulses occur only when there is coincidence between individual members of the created grating elements and individual fringes of the fringe pattern.

2. A method as claimed in claim 1, wherein the fringe pattern is a fringe pattern of light.

3. A method as claimed in claim 2, wherein the fringe pattern of light is of ultra violet light.

4. A method as claimed in claim 2, wherein the medium in which the grating elements are written is photoresist.

5. A method as claimed in claim 1, wherein the phase of the diffracted beam is employed to generate a control signal by optically interfering it upon a photodetector with a reference signal of predetermined phase.

6. A method as claimed in claim 5, wherein the reference signal of predetermined phase is provided by employing part of the interrogation beam of light to produce a further diffracted beam of light provided by diffraction from grating elements formed in a control grating.

7. A method as claimed in claim 1, wherein the medium in which the grating elements are written is the core of an optical waveguide.

8. A method as claimed in claim 1, wherein the fringe pattern is created by a diffraction grating.

9. A method as claimed in claim 1, wherein the fringe pattern has a pitch whose value is varied during the writing of the grating so as to write a chirped grating.

10. A method of writing a grating in a medium, wherein grating elements of the grating are created in the medium by a pulsed effectively linear fringe pattern, wherein light of a wavelength not employed for said creation of the grating is directed at ones of the written grating elements during said writing to form a diffracted beam of light diffracted by said ones of the written grating elements, wherein the medium is progressively moved relative to the fringe pattern in a manner repetitively providing coincidence between individual ones of the written grating elements and different ones of the fringes of the fringe pattern, and the phase of the diffracted beam of light is monitored to generate a control signal which is employed to control the pulsing of the fringe pattern such that, subsequent to the commencement of said relative movement following commencement of the creation of the grating elements, each succeeding pulse is timed to occur only when there is coincidence between individual ones of the grating elements and individual ones of the fringes of the fringe pattern.

11. A method of progressively writing in a medium a grating composed of a series of grating elements spaced at a uniform pitch, which grating elements are created in the medium by a pulsed fringe pattern composed of a set of effectively linear fringes spaced at a uniform pitch, wherein the medium is moved progressively relative to the fringe pattern so that the written grating elements pass through coincidence with different fringes of the fringe pattern, wherein light of a wavelength not employed for said creation of the grating is directed at ones of the written grating elements during said writing to form a diffracted beam of light diffracted by said ones of the written grating elements, wherein the phase of said diffracted beam of light is monitored to generate a control signal which is employed to control the pulsing of the fringe pattern such that, once the writing of the grating elements has commenced, the fringe pattern pulses are timed to occur only when there is coincidence between individual ones of the grating elements and individual fringes of the fringe pattern.

12. A method as claimed in claim 11, wherein the fringe pattern is a fringe pattern of light.

13. A method as claimed in claim 12, wherein the fringe pattern of light is of ultra violet light.

14. A method as claimed in claim 12, wherein the medium in which the grating elements are written is photoresist.

15. A method as claimed in claim 11, wherein the phase of the diffracted beam is employed to generate a control signal by optically interfering it upon a photodetector with a reference signal of predetermined phase.

16. A method as claimed in claim 15, wherein the reference signal of predetermined phase is provided by employing part of the light of a wavelength not employed for said creation of the grating to produce a further diffracted beam of light provided by diffraction from grating elements formed in a control grating.

17. A method as claimed in claim 11, wherein the medium in which the grating elements are written is the core of an optical waveguide.

18. A method as claimed in claim 11, wherein the fringe pattern is created by a diffraction grating.

19. A method as claimed in claim 11, wherein the fringe pattern has a pitch whose value is varied during the writing of the grating so as to write a chirped grating.

* * * * *